United States Patent [19]

Neppl et al.

[11] Patent Number: 4,640,844
[45] Date of Patent: * Feb. 3, 1987

[54] METHOD FOR THE MANUFACTURE OF GATE ELECTRODES FORMED OF DOUBLE LAYERS OF METAL SILICIDES HAVING A HIGH MELTING POINT AND DOPED POLYCRYSTALLINE SILICON

[75] Inventors: Franz Neppl; Ulrich Schwabe, both of Munich; Konrad Hieber, Bernau, all of Fed. Rep. of Germany

[73] Assignee: Siemens Aktiengesellschaft, Berlin and Munich, Fed. Rep. of Germany

[ * ] Notice: The portion of the term of this patent subsequent to Jun. 25, 2002 has been disclaimed.

[21] Appl. No.: 709,712

[22] Filed: Mar. 8, 1985

[30] Foreign Application Priority Data

Mar. 22, 1984 [DE] Fed. Rep. of Germany ....... 3419034

[51] Int. Cl.$^4$ .................... B05D 5/12; C23C 16/00
[52] U.S. Cl. ...................................... 427/38; 427/85; 427/93
[58] Field of Search ............... 427/38, 85, 93; 29/571; 148/DIG. 10, DIG. 82, DIG. 147

[56] References Cited

U.S. PATENT DOCUMENTS 4,525,378  6/1985  Schwabe et al. ...................... 427/38

OTHER PUBLICATIONS

J. Vac. Sci. Technol., 17 (4), Jul./Aug., 1980, "Refractory Silicides for Integrated Circuits" by S. P. Murarka, pp. 775–792.

J. Electrochem. Soc., vol. 129, No. 6 (1982), "Electrical Properties of Composite Evaporated Silicide/Polysilicon Electrodes", by C. Koburger et al., pp. 1307 to 1312.

Digest of Technical Papers of the 1983 Symposium on VLSI Technology, Hawaii, by Fukumoto et al., "A New MoSi$_2$/Thin-Poly Si Gate Process, pp. 98/99.

Primary Examiner—John H. Newsome
Attorney, Agent, or Firm—Hill, Van Santen, Steadman & Simpson

[57] ABSTRACT

A method for manufacture of gate electrodes formed of double layers of metal silicides having a high melting point and doped polycrystalline silicon. The polycrystalline silicon is deposited in undoped fashion before the metal silicide and the doping of the silicon is obtained through the production of the source/drain-zones through ion implantation and a subsequent high temperature step. The method permits the problem-free manufacture of polycide-gates with n$^+$- and p$^+$-polysilicon on a chip without increased technological expense. Planarization is facilitated through the thin gate layers. The method is used in the manufacture of highly integrated CMOS-circuits.

10 Claims, 5 Drawing Figures

METHOD FOR THE MANUFACTURE OF GATE ELECTRODES FORMED OF DOUBLE LAYERS OF METAL SILICIDES HAVING A HIGH MELTING POINT AND DOPED POLYCRYSTALLINE SILICON

BACKGROUND OF THE INVENTION

The invention relates to a method for the manufacture of gate electrodes formed of double layers of metal silicides having a high melting point, and doped polycrystalline silicides (polycide), in particular for integrated complementary MOS-field effect transistor circuits (CMOS) wherein the manufacture of the source/drain zones is provided through ion implantation after the production of the gate electrode pursuant to use of the gate electrode as an implantation mask.

In order to increase switching and access times in integrated MOS-circuits, in modern processing n+-polysilicon is replaced by a double layer formed by coating strongly phosphorous-doped polycrystalline silicon with a metal silicide having a high melting point; for example, tantalum disilicide, tungsten disilicide, or molybdenum silicide. Such double layers are designated as polycides. Their properties are discussed in an article by S. P. Murarka from J. Vac. Sci. Technol., 17 (4) July/August, 1980 on pages 775 to 792, incorporated herein by reference.

The high phosphorous concentration in polysilicon has a relatively thick natural oxide on the polysilicon which can lead to unreproducible polysilicon/silicide boundary surfaces or interferences. This obstructs the interface-reaction possibly necessary for the adjustment of the precise stoichiometry of the metal disilicides, influences the etching behavior and the oxidation of the polycides, as well as the loss of phosphor during subsequent temperature treatments. Fluctuating or even locally varying phosphor concentration in the polycide layer induces unreproducible etching and, primarily in the case of thermal re-oxidation, can lead to polycide damage. Moreover, a relatively thick polysilicon layer is required which brings about unnecessarily high steps in the polysilicon plane. As explained in an article by C. Koburger et al from the J. Electrochem. Soc., Vol. 129, No. 6 (1982), on pages 1307 to 1312, incorporated herein by reference, in the case of thinner layers, oxide breakthroughs occur in an increased fashion. Moreover, without a considerable increased expense, two conductivity types cannot be produced in the polysilicon plane which, in the case of CMOS-circuits, leads to relatively poor p-channel-properties (unfavorable work function). The use of n+- and p+-polysilicon without metal silicide on a chip makes available for n- and p-channel-MOS-field effect transistors, gates with a more favorable work function. However, it requires metal bridges between n+- and p+-polysilicon as well as additional masking steps.

The minimum demands of the polysilicon thickness could be made less stringent in the case of manufacture of polycides by use of molybdenum silicide ($MoSi_2$) since first undoped polycrystalline silicon is employed which is doped only subsequent to the molybdenum disilicide deposition by ion implantation of phosphor. The thickness of the oxide (stratum oxide) resulting through thermal oxidation between polysilicon and silicide is reduced. Harmful local interface reactions are replaced by homogeneous reactions and no gate oxide damages occur any longer. Further details can be learned from a report by M. Fukumoto et al from Paper 7-7 in the Digest of Technical Papers of the 1983 Symposium on VLSI-technology, Hawaii, on pages 98/99, incorporated herein by reference.

A method of the initially cited type has been proposed in German patent application No. P 33 30 851.9, corresponding to U.S. Ser. No. 617,590, incorporated herein by reference. In the case of this method, the p-channel properties, given a specified low starting or threshold voltage can, indeed, be improved through use of a silicide gate (more favorable work function), whereby, however, the known favorable MOS properties of the polysilicon/$SiO_2$ interface must be dispensed with.

SUMMARY OF THE INVENTION

An object of the invention is to provide a method with which, without great increased technological expense, polycide-gates with n+-polysilicon (n-channel) and p+-polysilicon (p-channel) can be simultaneously produced on a chip without non-reproducible polysilicon/silicide interfaces resulting. Also, the deposition of thick layers is to be avoided, which counteracts the planarization of the component structures.

According to the invention, first a layer formed of undoped polycrystalline silicon is deposited on the substrate surface provided with the gate oxide layer. The metal silicide layer is then applied thereupon. The polycide double layer is structured. The source/drain zones are successively implanted, after a respective masking of the other channel types, so that the metal silicide layers are correspondingly doped. After deposition of the intermediate oxide through a temperature treatment, the dopants introduced through the ion implantation are diffused from the metal silicide into the polycrystalline silicon.

Through the method according to the teaching of the invention, the CMOS-process with a polycide gate with n+- and p+-polysilicon is substantially simplified since the corresponding dopants such as arsenic, phosphorous, or boron, and which are implanted in the silicide of the n-channel or p-channel transistor gates and in the two source/drain-implantations and through the subsequent temperature treatment (drive-in), are driven into the polysilicon disposed beneath the silicide. The n+- and p+-components of the polysilicon are short-circuited from the start by the metal silicide. With use of tantalum disilicide, the diffusion of the cited dopants from the silicide into the silicon has been proven through secondary ion mask spectrometry and electrical measurements. When phosphorous is used, in order to prevent dopant loss through the silicide surface during the drive-in, an oxide covering of the silicon is necessary before the drive-in. When boron is used, the oxide (stratum oxide) resulting through thermal oxidation must be completely removed. This can occur, for example, through overetching in the silicide deposition installation (for example, sputter etching in the case of sputter processes).

The method of polysilicon doping after the metal silicide deposition makes it possible to deposit polycrystalline silicon and metal silicide successively without aeration in an installation. This can proceed through, for example, silicon vapor-deposition and tantalum-silicon co-vaporization, through silicon sputtering and tantalum disilicide sputtering, or through chemical deposition of silicon from the gas phase (CVD) and CVD-tantalum disilicide. A reproducibly virtually clean oxide-free interface can thus be obtained. The above mentioned combined CVD-method offers the maximum silicon purity, the cleanest interface to the silicide, and a best-possible edge covering.

The advantages of the CMOS-polycide process of the invention can be summarized as follows:

1. Retention of the polysilicon/SiO$_2$ interface;
2. Possibility of combined polysilicon/silicide deposition;
3. Minimum or no stratum oxide between polysilicon and silicide;
4. Easier planarization through thin polysilicon (lesser step height);
5. A possibility of manufacture of "buried contacts" in n+- and p+-diffusion zones;
6. Facilitation of the polycide structuring and reoxidation as a consequence of lacking fluctuating dopant concentrations and varying quality of the silicide/polysilicon interface;
7. Simple realization of p+- and n+-polycide on a chip (work function of the gate material matched to the transistor type); and
8. Optimum p-channel properties (CMOS) through favorable work function of the gate material of p+-polysilicon.

Except for the possibility cited under points 7 and 8 above, these advantages also come to bear in the case of NMOS-processes.

Further embodiments of the invention, in particular a proposal for a possible process realization for the manufacture of a CMOS-arrangement, are set forth hereafter.

DESCRIPTION OF THE PREFERRED EMBODIMENTS

Figure 1:
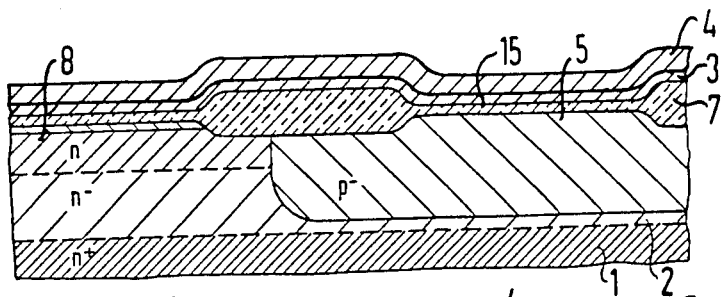
FIGS. 1 through 5 illustrate in sectional views method steps significant in terms of the invention, and illustrate a preferred CMOS process.

FIG. 1: In an n+-doped silicon crystal substrate 1, an n−-doped epitaxial layer 2, a p−-trough 5, an n-trough 8, and field oxide zones 7 are produced. Through thermal oxidation of the entire surface, a thickness of the gate oxide layer 15 is adjusted to 30 nm. Then the first step significant for the invention is performed—namely, a deposition of the undoped polycrystalline silicon layer 3 with a layer thickness of, for example, 50 nm, through a chemical gas deposition (CVD). A layer 4 formed of tantalum disilicide is then applied with a layer thickness of approximately 200 nm through a CFD-process. Since the polysilicon in accordance with the invention can still remain undoped, it is possible to deposit the two layers 3, 4 successively without aeration in an installation. A reproducibly virtually clean oxide-free interface can thus be obtained.

Figure 2:
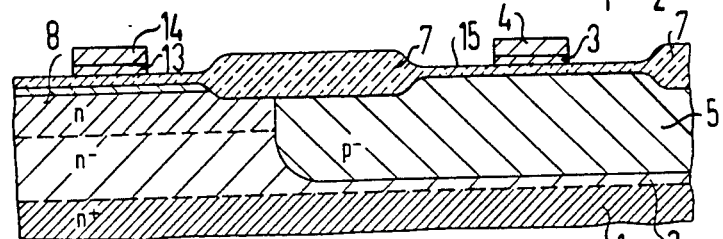

FIG. 2: A structuring of the polycide layer 3, formed of the undoped polycrystalline silicon 3 and the tantalum disilicide 4, proceeds through reactive ion etching. For example, this can occur in a chloron-boron-trichloride-etching mixture through use of a photo resist mask. For the crystallization of the tantalum disilicide layer 4, 14, an annealing at 900 degrees C. (20 min.) is carried out. The arrangement illustrated in FIG. 2 results.

Figure 3:
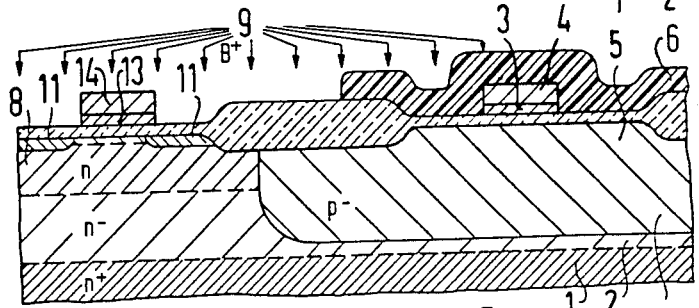

FIG. 3: Following the structuring of the gates (3, 4, 13, 14), a photoresist structure 6 which covers the zones of the n-channel transistors in the p-trough 5 is applied. A boron ion implantation 9 is then carried out in order to produce the source/drain zones 11 of the p-channel transistors in the n-trough 8 with the dosage and energy of $5 \times 10^{15}$ cm$^{-2}$ and 25 keV. Boron is thus simultaneously implanted in the tantalum silicide 14 of the p-channel transistors.

Figure 4:
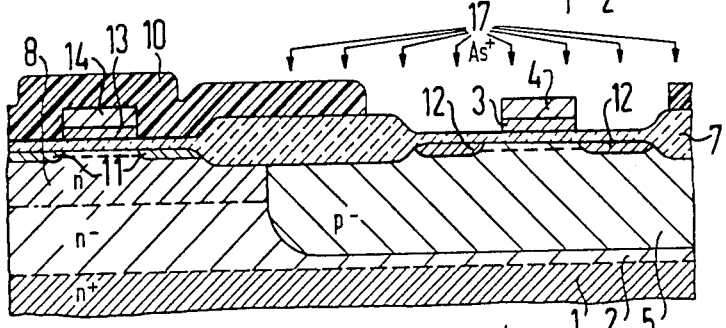

FIG. 4: After detachment of the photoresist structure 6, an additional photoresist structure 10 which covers the zones of the p-channel transistors in the n-trough 8 is applied, and an arsenic-ion-implantation 17 with a dosage and energy of $5 \times 10^{15}$ cm$^{-2}$ and 80 keV is carried out in order to produce the source/drain zones 12 for the n-channel transistor. The tantalum silicide 4 is simultaneously doped.

Figure 5:
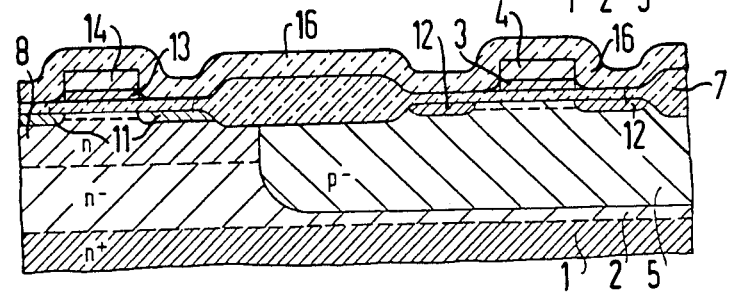

FIG. 5: After the removal of the photoresist structure 10 and after the application of the 700 nm-thick intermediate oxide layer 16 formed of SiO$_2$, a temperature treatment in a nitrogen/hydrogen atmosphere for driving-in the implanted boron and arsenic ions (9, 17) at 900 degrees C. (60 min.) is carried out. The source/drain zones 11 of the p-channel transistors and the source/drain zones 12 of the n-channel transistors result. Simultaneously, a diffusion of the dopants from the tantalum silicide layer 4, 14 into the polycrystalline silicon 3, 13 takes place.

The completion of the arrangement, such as opening of the contact hole zones and manufacturing the metal-printed conductor plane, proceeds according to known method steps of CMOS-technology.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for manufacture of gate electrodes formed of double layers of metal silicides having a high melting point and doped polycrystalline silicon (polycide) for integrated complementary MOS-field effect transistor circuits (CMOS) in which manufacture of source and drain zones is carried out through ion implantation in n-type and p-type zones in a substrate with a field oxide zone thereover after production of a gate electrode through use of the gate electrode as an implementation mask, comprising the steps of:

(a) depositing a layer formed of undoped polycrystalline silicon on the gate oxide layer lying over the n- and p-type zones in the substrate;
    (b) applying a metal silicide layer on the undoped polycrystalline silicon layer so as to create a polycide double layer;
    (c) structuring the polycide double layer so as to create respective gates above the n- and p-type zones;
    (d) implanting source and drain zones of one transistor conductivity type with a respective dopant while masking zones of the opposite transistor conductivity type and vice versa, and wherein during the implanting, the respective structured metal silicide layers are also correspondingly doped with respective dopants; and
    (e) removing the masks, depositing an intermediate oxide through a temperature treatment, and then diffusing said respective dopants introduced into said respective structured metal silicide layers from the respective metal silicide layers into the respective structured polycrystalline silicon layers lying therebeneath.

2. A method according to claim 1 including the step of manufacturing the polycide double layer through vapor deposition.

3. A method according to claim 1 including the steps of manufacturing the polycide double layer through sputtering.

4. A method according to claim 1 including the step of manufacturing the polycide double layer through chemical vapor deposition (CVD).

5. A method according to claim 1 including the step of adjusting a layer thickness of the undoped polycrystalline silicon layer to less than 300 nm.

6. A method according to claim 1 including the step of adjusting a layer thickness of the polycrystalline silicon layer to a range between 20 to 300 nm, and adjusting a layer thickness of the metal silicide layer to a range of 100 to 400 nm.

7. A method according to claim 1 including the step of employing as metal silicides disilicides of metals selected from the group consisting of tantalum, molybdenum, tungsten, and titanium.

8. A method according to claim 1 including the step of employing for the ion implantation dopants selected from the group consisting of arsenic, phosphorous, and boron.

9. A method for manufacture of integrated complementary MOS-field effect transistor circuits, (CMOS), comprising the steps of:
  (a) providing n-type and p-type zones in a substrate;
  (b) providing a field oxide zone over the n- and p-type zones;
  (c) depositing a layer formed of undoped polycrystalline siicon on the gate oxide layer lying over the n- and p-type zones in the substrate;
  (d) applying a metal silicide layer on the undoped polycrystalline silicon layer so as to create a polycide double layer;
  (e) structuring the polycide double layer so as to create respective gates over the n- and p-type zones;
  (f) implanting source and drain zones of one transistor conductivity type with a respective dopant by using the structured gate of the one transistor type while masking zones of the opposite transistor conductivity type and vice versa, and wherein during each of the implantings, the respective metal silicide layer of the respective metal silicide double layer is also correspondingly doped with the respective dopant; and
  (g) removing the masks, depositing an intermediate oxide layer, and then diffusing said respective dopant introduced into said respective silicide layer of said double layers from the respective metal silicide layer into the respective polycrystalline silicon layer thereat.

10. A method for manufacture of an integrated MOS-field effect transistor (CMOS), comprising the steps of:
  (a) providing a first conductivity type zone in a substrate;
  (b) providing a field oxide zone over the zone;
  (c) depositing a layer formed of undoped polycrystalline silicon on the gate oxide layer lying over the first conductivity type zone in the substrate;
  (d) applying a metal silicide layer on the undoped polycrystalline silicon layer so as to create a polycide double layer;
  (e) structuring the polycide double layer so as to create a gate over the first conductivity type zone;
  (f) implanting source and drain zones with a dopant by using the structured gate, and wherein during the implanting, the metal silicide layer of the respective metal silicide double layer is also correspondingly doped with the dopant; and
  (g) depositing an intermediate oxide layer, and thereafter diffusing the dopant introduced into said silicide layer of said double layer from the metal silicide layer into the polycrystalline silicon layer.

* * * * *